United States Patent
Tao et al.

(10) Patent No.: US 11,869,969 B2
(45) Date of Patent: Jan. 9, 2024

(54) SEMICONDUCTOR DEVICE AND METHOD FOR MANUFACTURING THE SAME

(71) Applicant: XIAMEN SANAN INTEGRATED CIRCUIT CO., LTD., Fujian (CN)

(72) Inventors: Yonghong Tao, Fujian (CN); Wenbi Cai, Fujian (CN); Zhigao Peng, Fujian (CN); Lijun Li, Fujian (CN); Yuanxu Guo, Fujian (CN)

(73) Assignee: HUNAN SAN'AN SEMICONDUCTOR CO., LTD., Hunan (CN)

( * ) Notice: Subject to any disclaimer, the term of this patent is extended or adjusted under 35 U.S.C. 154(b) by 0 days.

(21) Appl. No.: 17/565,667

(22) Filed: Dec. 30, 2021

(65) Prior Publication Data

US 2022/0209010 A1  Jun. 30, 2022

(30) Foreign Application Priority Data

Dec. 31, 2020 (CN) .......................... 202011625678.0

(51) Int. Cl.
*H01L 29/78* (2006.01)

(52) U.S. Cl.
CPC ...... *H01L 29/7825* (2013.01); *H01L 29/7806* (2013.01); *H01L 29/7839* (2013.01)

(58) Field of Classification Search
CPC ............. H01L 29/7825; H01L 29/7806; H01L 29/7839; H01L 29/0696; H01L 29/66068; H01L 29/7811; H01L 29/1608; H01L 29/0603; H01L 29/66477; H01L 29/78
See application file for complete search history.

(56) References Cited

U.S. PATENT DOCUMENTS

2023/0133459 A1* 5/2023 Tanaka ................ H01L 29/7811
257/77

* cited by examiner

*Primary Examiner* — Mohammed R Alam
(74) *Attorney, Agent, or Firm* — Muncy, Geissler, Olds & Lowe P.C.

(57) ABSTRACT

A semiconductor device includes a semiconductor substrate, an epitaxial layer disposed on the semiconductor substrate, a cell zone including multiple unit cells disposed in the epitaxial layer opposite to the semiconductor substrate, a transition zone having a doped region and surrounding the cell zone, a source electrode unit disposed on the epitaxial layer opposite to the semiconductor substrate, and multiple gate electrode units. Each unit cell includes a well region, a source region disposed in the well region, and a well contact region extending through the source region to contact the well region. A method for manufacturing the semiconductor device is also disclosed.

11 Claims, 10 Drawing Sheets

SEMICONDUCTOR DEVICE AND METHOD FOR MANUFACTURING THE SAME

CROSS-REFERENCE TO RELATED APPLICATION

This application claims priority of Chinese Invention Patent Application No. 202011625678.0, filed on Dec. 31, 2020.

FIELD

The disclosure relates to a semiconductor device and a method for manufacturing the same, and more particularly to a silicon carbide (SiC) metal-oxide-semiconductor field-effect transistor (MOSFET) and a method for manufacturing the same.

BACKGROUND

Due to resource depletion, the demand for green energy devices has been significantly increased. Therefore, the third generation semiconductor, also referred to as the wide bandgap semiconductor, have been actively developed. Silicon carbide (SiC) is a wide bandgap semiconductor material which is commonly used in power devices due to its superior characteristics, such as a high breakdown electric field, a high saturated drift velocity of electrons, and an excellent thermal conductivity. SiC power devices, e.g., SiC metal-oxide-semiconductor field-effect transistors (SiC MOSFETs) have been widely communication/server, photovoltaic inverter, or new energy vehicles.

Different from an insulated gate bipolar transistor (IGBT), SiC MOSFET has a parasitic body diode that can be used as a freewheeling diode in a reverse current path of a DC-DC converter, so that there is no need to place a diode in parallel to a switch, thereby reducing the volume and cost of the DC-DC converter. However, the parasitic body diode might be a P-N diode having a high forward voltage drop, which might cause more power loss compared to a traditional SiC schottky diode. Further, the temperature of the parasitic body diode might be relatively high when the SiC MOSFET is operated at light load for non-synchronous rectification, thereby decreasing the conductance of a channel of the SiC MOSFET and thus its reliability.

In the structural design of the SiC MOSFET, how to increase the forward current of the body diode of the SiC MOSFET is a major challenge. To date, replacing the P-N diode with a schottky diode, which might significantly decrease the power loss of the body diode of the SiC MOSFET, or increasing the surface area of the P+ region in a unit cell, which could increase the forward current of the body diode of the SiC MOSFET, had been carried out. Nevertheless, use of the schottky diode might increase the complexity of the fabrication process, and might result in an increase in the volume and the fabrication cost of the SiC MOSFET. On the other hand, the increase in the surface area of the P+ region in the unit cell might decrease the conductance of the channel and the current density of the SiC MOSFET, and thus, increases the fabrication cost.

SUMMARY

Therefore, an object of the disclosure is to provide a semiconductor device that can alleviate at least one of the drawbacks of the prior art.

According to a first aspect of the present disclosure, the semiconductor device includes a semiconductor substrate, an epitaxial layer disposed on the semiconductor substrate, a cell zone including a plurality of unit cells disposed in the epitaxial layer opposite to the semiconductor substrate, a transition zone having a doped region and surrounding the cell zone, a source electrode unit disposed on the epitaxial layer opposite to the semiconductor substrate, and a plurality of gate electrode units.

Each of the unit cells includes a well region having a first conductive type, a source region having a second conductive type and disposed in the well region, and a well contact region having the first conductive type and extending through the source region to contact the well region. The doped region of the transition zone has the first conductive type, is disposed in the epitaxial layer opposite to the semiconductor substrate, and is directly connected to the well contact region of at least one of the unit cells. The source electrode unit includes a first portion and a second portion connected to the first portion. Each of the gate electrode units is disposed on the epitaxial layer opposite to the semiconductor substrate, and extends between two adjacent ones of the unit cells to cover a portion of the source region of each of the adjacent ones of the unit cells.

The first portion of the source electrode unit is electrically connected to the well contact region and a portion of the source region of each of the unit cells. The second portion of the source electrode unit is electrically connected to the doped region of the transition zone.

According to a second aspect of the present disclosure, the semiconductor device includes a semiconductor substrate, an epitaxial layer disposed on the semiconductor substrate, a cell zone including a plurality of unit cells disposed in the epitaxial layer opposite to the semiconductor substrate, a transition zone surrounding the cell zone and having a doped region, a source electrode unit disposed on the epitaxial layer opposite to the semiconductor substrate, and a plurality of gate electrode units.

Each of the unit cells includes a well region having a first conductive type, a source region having a second conductive type and disposed in the well region, and a well contact region having the first conductive type and extending through the source region to contact the well region. The doped region of the transition zone has the first conductive type, and is disposed in the epitaxial layer opposite to the semiconductor substrate and separated from the well contact region of each of the unit cells. The source electrode unit includes a first portion and a second portion connected to the first portion. Each of the gate electrode units is disposed on the epitaxial layer opposite to the semiconductor substrate, and extends between two adjacent ones of the unit cells to cover a portion of the source region of each of the two adjacent ones of the unit cells.

The first portion of the source electrode unit is electrically connected to the well contact region and a portion of the source region of each of the unit cells. The second portion of the source electrode unit is electrically connected to the doped region of the transition zone.

According to a third aspect of the present disclosure, a method for manufacturing a semiconductor device includes:
providing a semiconductor structure that includes a semiconductor substrate, an epitaxial layer which is formed on the semiconductor substrate and which has a central area and a peripheral area surrounding the central area, a plurality of well regions separately disposed in the central area of the epitaxial layer, and a plurality of source regions respectively disposed in the well regions;

forming a plurality of well contact regions in the well regions, respectively, by implantation, the well contact regions respectively extending through the source regions to contact the well regions; and forming a doped region in the peripheral area of the epitaxial layer to form a transition zone by implantation, wherein the doped region of the transition zone and each of the well contact regions have the same conductive type.

BRIEF DESCRIPTION OF THE DRAWINGS

Other features and advantages of the disclosure will become apparent in the following detailed description of the embodiments with reference to the accompanying drawings, of which.

DETAILED DESCRIPTION

The detailed description is described in combination of the accompanying figures. Before the disclosure is described in greater detail, it should be noted that where considered appropriate, reference numerals or terminal portions of reference numerals have been repeated among the figures to indicate corresponding or analogous elements, which may optionally have similar characteristics for clarity, unless clearly indicated to the contrary. The figures are shown by way of illustration for better understanding and is not scaled based on its actual dimensions so that it can be adjusted according to design demand. In the present disclosure, reference is made to the accompanying drawings that form a part hereof, and in which is shown by way of illustration how a number of examples of the disclosure can be practiced.

The definition of the upper and lower positions and the front and back faces of relative elements may be easily understood by a skilled artisan as relative positions so that the elements could be flipped upside down. In this regard, the term "top", "bottom", "under", "front", "back", "rear", "antecedent" or "behind" could be used with reference to the orientation shown in the figures. Since parts in the embodiments could be oriented in various directions, the term used to describe the orientation of the parts is not limited and is only used for illustration. It should be understood that other embodiments can be used and that structural and logic changes can be made without departing from the spirit and scope of the present disclosure. The following detailed description, therefore, is not to be taken in a limiting sense, and the scope of the present disclosure is defined by the appended claims.

The following detailed description refers to the accompanying figures, and one or more examples of each embodiment are illustrated in figures. Each example is provided for illustration, and is not intended to be limiting. For instance, the features shown in the figures as parts of an embodiment could be applied to other embodiments or used in combination of other embodiments.

Figure 1:
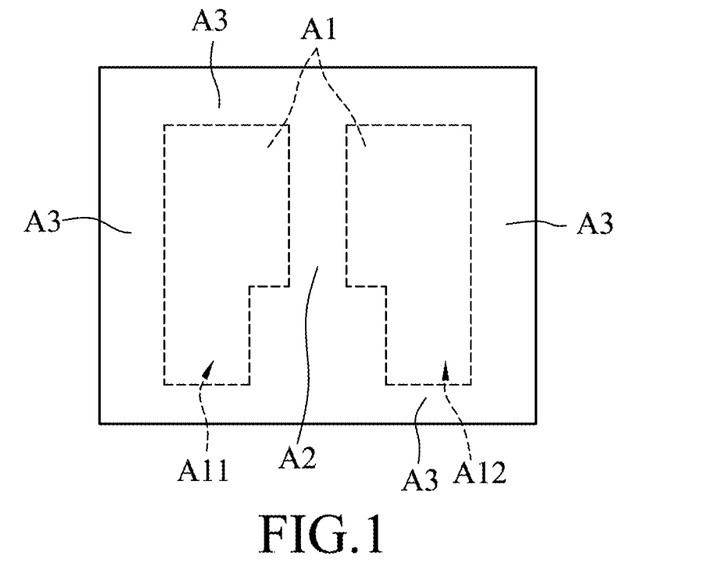
FIG. 1 is a schematic top view illustrating an embodiment of a semiconductor device according to the disclosure, except that a source electrode unit and a plurality of gate electrode units are omitted therefrom.
Figure 2:
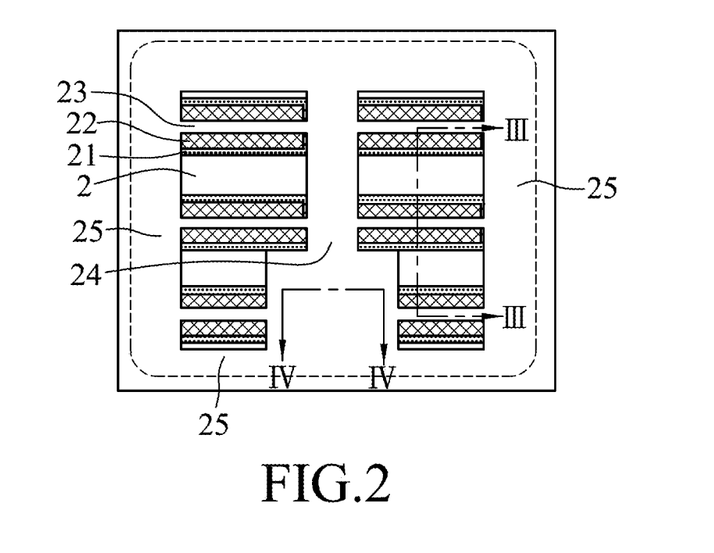
FIG. 2 is a schematic top view illustrating the details of a cell zone of the embodiment.
Figure 3:
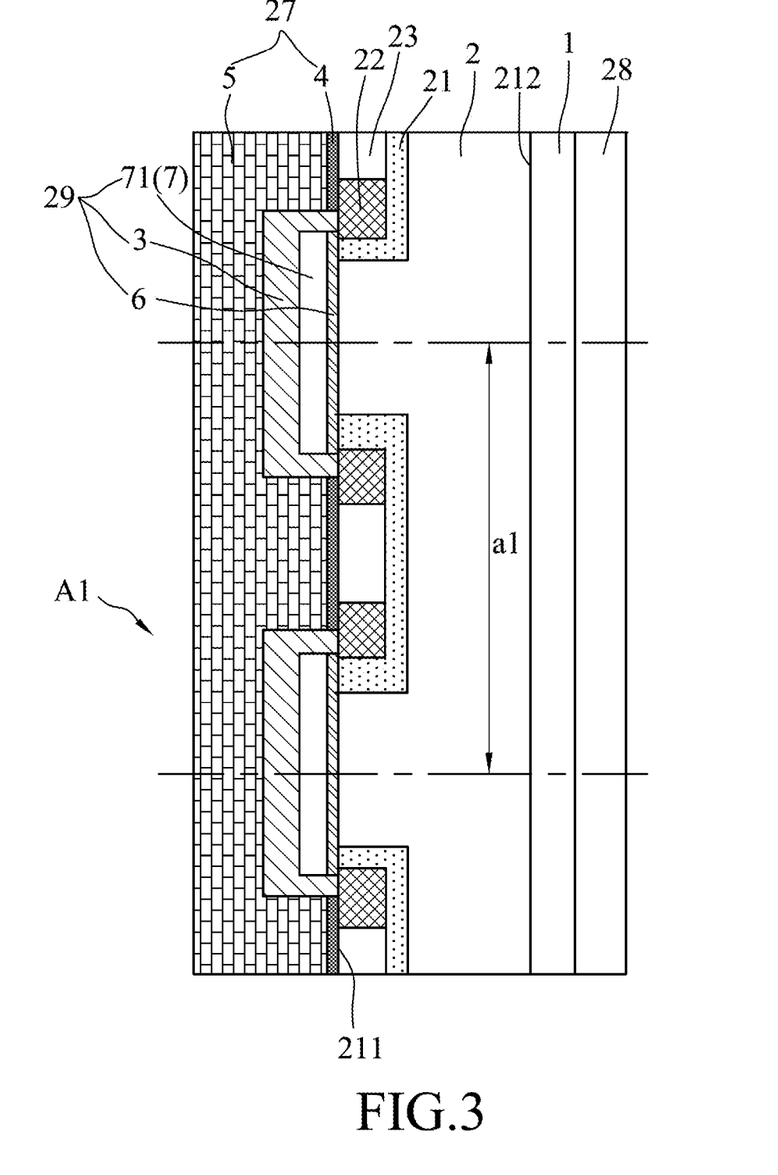
FIG. 3 is a sectional view taken along line III-III of FIG. 2, and also illustrates a source electrode unit and a plurality of gate electrode units formed on a structure shown in FIG. 2.
Figure 17:
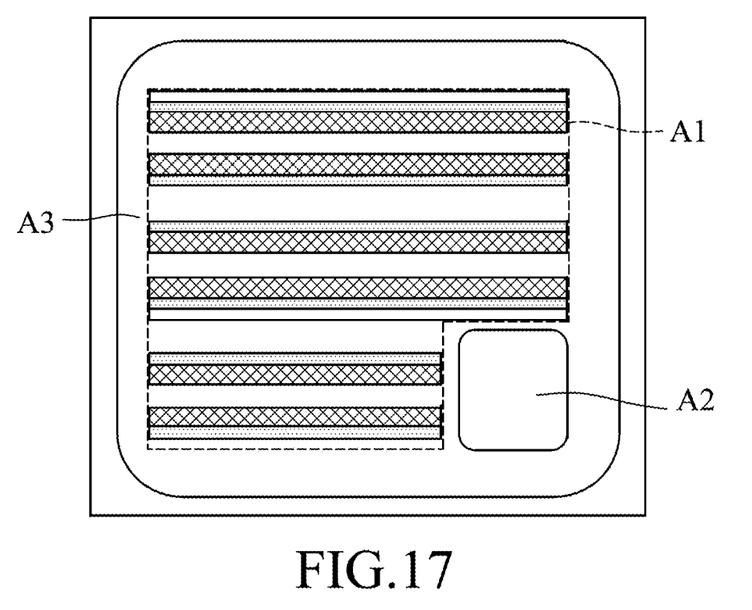
FIGS. 17 and 18 are schematic views illustrating two variations of gate zones of the embodiment.
Figure 18:
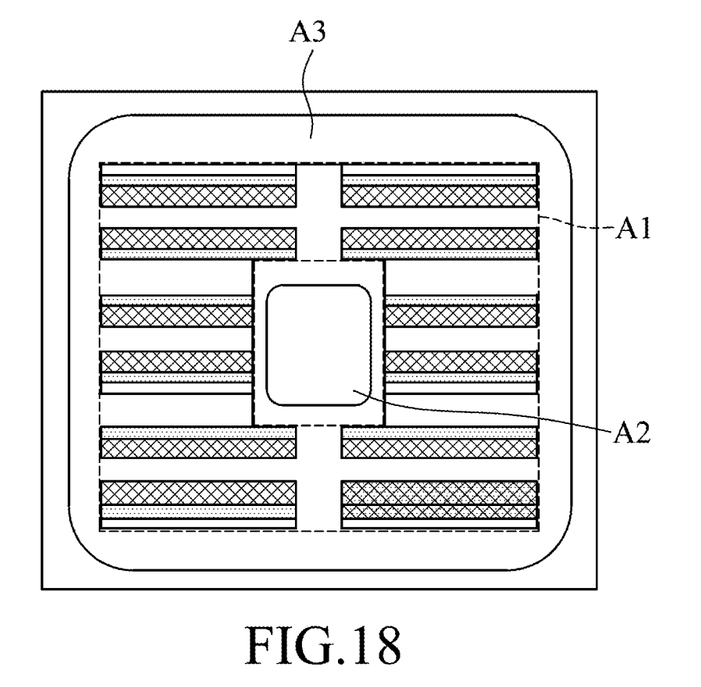

Referring to FIGS. 1 to 3, an embodiment of a semiconductor device according to the present disclosure includes a semiconductor substrate 1, and an epitaxial layer 2 disposed on the semiconductor substrate 1 and having a first surface 211 and a second surface 212. The semiconductor device further includes a cell zone (A1), a gate zone (A2) and a transition zone (A3) surrounding the cell zone (A1) and the gate zone (A2). In this embodiment, the cell zone (A1) includes a first zone (A11) and a second zone (A12), and the gate zone (A2) is disposed between the first zone (A11) and the second zone (A12). In certain embodiments, as shown in FIG. 17, the gate zone (A2) may be positioned at the center of the epitaxial layer 2, and is surrounded by the cell zone (A1). In other embodiments, as shown in FIG. 18, the gate zone (A2) may be positioned at the corner of the epitaxial layer 2.

Referring to FIGS. 2 and 3, the cell zone (A1) includes a plurality of unit cells (a1) disposed in the epitaxial layer 2 opposite to the semiconductor substrate 1 and adjacent to the first surface 212 of the epitaxial layer 2. Each of the unit cells (a1) includes a well region 21 having a first conductive type, a source region 22 having a second conductive type and disposed in the well region 21, and a well contact region 23 having the first conductive type and extending through the source region 22 to contact the well region 21. A region of the epitaxial layer 2, which is disposed between two adjacent unit cells (a1), functions as a junction field effect transistor (JFET) region. The first conductive type may be one of a P-type and an N-type, and the second conductive type may be the other one of the P-type and the N-type.

Figure 15:
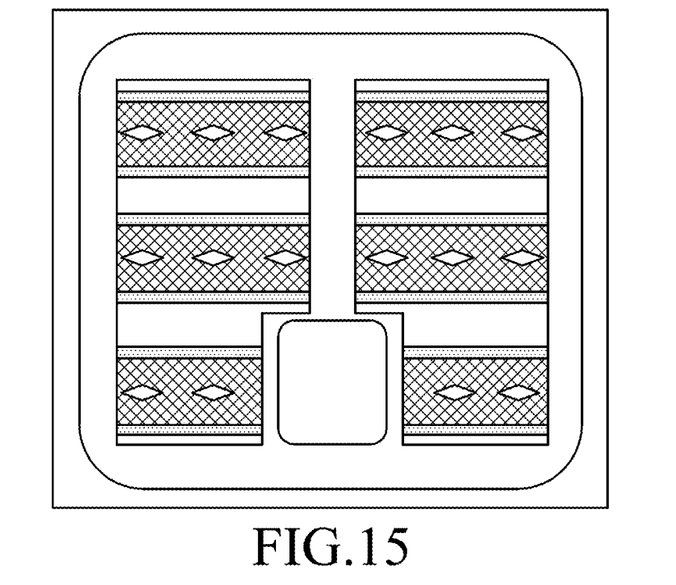
FIGS. 15 and 16 are schematic views illustrating two variations of well contact regions of the embodiment.
Figure 16:
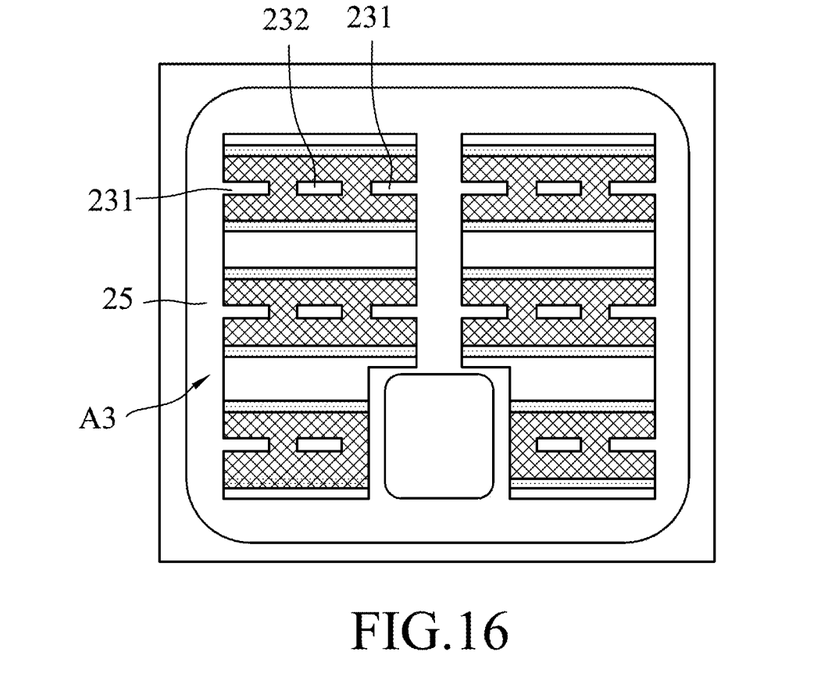

The transition zone (A3) has a doped region 25 which has the first conductive type and which is disposed in the epitaxial layer 2 opposite to the semiconductor substrate 1. In some embodiments, the doped region 25 is continuous with (i.e., directly connected to) the well contact region 23 of at least one of the unit cells (a1). In certain embodiments, each of the well contact regions 23 may have a plurality of separated sub-regions, and the doped region 25 is directly connected to at least one of the sub-regions disposed adjacent to the transition zone (A3). In this embodiment, the doped region 25 is directly connected to the well contact region 23 of each of the unit cells (a1). In some embodiments, the doped region 25 is separated from the well contact region 23 of each of the unit cells (a1), as shown in FIGS. 15 and 16. In certain embodiments, the doped region 25 of the transition zone (A3) has a doping concentration (dopant dose) and an implanting depth (doping energy) the same as those of the well contact region 23 of at least one of the unit cells (a1). In certain embodiments, the doping concentration (dopant dose) and the implanting depth (doping energy) of the doped region 25 of the transition zone (A3) are the same as those of the well contact region 23 of each of the unit cells (a1). In certain embodiments, the doped region 25 of the transition zone (A3) and the well contact region 23 of each of the unit cells (a1) are simultaneously formed.

The gate zone (A2) includes a doped region 24 which is disposed in the epitaxial layer 2 and which is directly connected to and continuous with the well contact region 23 of at least one of the unit cells (a1). In certain embodiments, the doped region 24 is directly connected to the well contact region 23 of each of the unit cells (a1). In certain embodiments, the doped region 24 of the gate zone (A2) has a doping concentration and an implanting depth the same as those of the well contact region 23 of at least one of the unit cells (a1). In certain embodiments, the doping concentration and the implanting depth of the doped region 24 of the gate zone (A2) are the same as those of the well contact region 23 of each of the unit cells (a1). In certain embodiments, the doped region 24 of the gate zone (A2) and the well contact region 23 of each of the unit cells (a1) are simultaneously formed.

The semiconductor device further includes a source electrode unit 27 and a plurality of gate electrode units 29. The source electrode unit 27 is disposed on the first surface 211 of the epitaxial layer 2 opposite to the semiconductor substrate 1, and includes a first portion and a second portion connected to the first portion. The first portion of the source electrode unit 27 is electrically connected to the well contact region 23 and a portion of the source region 22 of each of the unit cells (a1). The second portion of the source electrode unit 27 is electrically connected to the doped region 25 of the transition zone (A3). The second portion of the source electrode unit 27 is of a ring shape, and surrounds the gate zone (A2) and the cell zone (A1).

Figure 5:
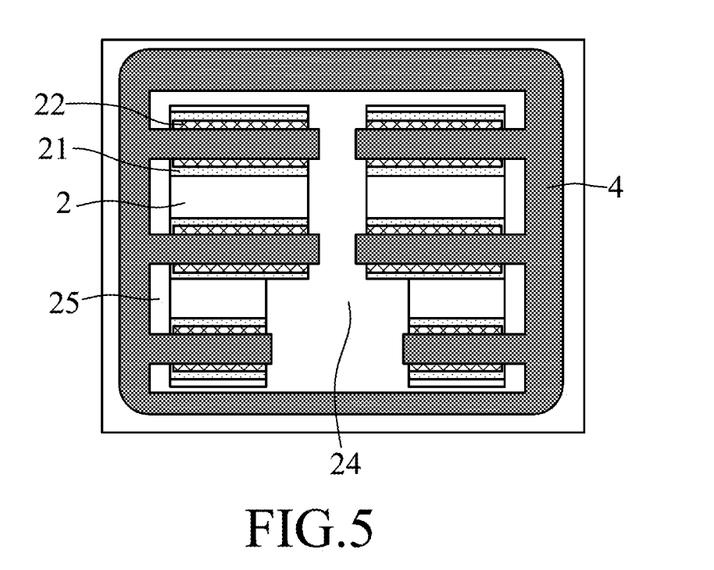
FIG. 5 is a schematic top view illustrating a source ohmic contact layer formed on the structure shown in FIG. 2.

The source electrode unit 27 includes a source ohmic contact layer 4 and a source electrode layer 5 disposed on the source ohmic contact layer 4. The source ohmic contact layer 4 of the first portion of the source electrode unit 27 is electrically connected to the well contact region 23 and a portion of the source region 22 of each of the unit cells (a1). The source ohmic contact layer 4 of the second portion of the source electrode unit 27 is electrically connected to the doped region 25 of the transition zone (A3). The source ohmic contact layer 4 of the second portion of the source electrode unit is electrically connected to the source ohmic contact layer 4 of the first portion of the source electrode unit 27. In some embodiments, the source ohmic contact layer 4 of the second portion of the source electrode unit 27 (i.e., at the transition zone (A3)) is also electrically connected to the well contact region 23 of each of the unit cells (a1), as shown in FIG. 5. In certain embodiments, the source ohmic contact layer 4 of the second portion of the source electrode unit 27 has a closed-ring structure. Referring to FIG. 15, in certain embodiments, the doped region 25 are separated from the well contact regions 23 the unit cells (a1), the source ohmic contact layer 4 of the second portion of the source electrode unit 27 may be also separated from the source ohmic contact layer 4 of the first portion of the source electrode unit 27. The first portion of the source electrode unit 27 is electrically connected to the second portion of the source electrode unit 27 through the source electrode layer 5. Referring to FIG. 16, each of the well contact regions 23 may have two end sub-regions 231 and at least one middle sub-region 232, and the doped region 25 is directly connected to one of the end sub-regions 231 disposed adjacent to the transition zone (A3). The source ohmic contact layer 4 above the end sub-regions 231 is electrically connected to the source ohmic contact layer 4 of the second portion of the source electrode unit 27. The doped region 25 is separated from the middle sub-region 232 of each of the well contact regions 23 and is electrically connected to the source ohmic contact layer 4 of the second portion of the source electrode unit 27, and is separated from the source ohmic contact layer 4 above the middle sub-region 232 of each of the well contact regions 23. The first portion of the source electrode unit 27 is electrically connected to the second portion of the source electrode unit 27 through the source electrode layer 5.

Referring back to FIG. 3, each of the gate electrode units 29 is disposed on the first surface 211 of the epitaxial layer 2 opposite to the semiconductor substrate 1, and extends between two adjacent ones of the unit cells (a1) to cover a portion of the source region 22 of each of the adjacent ones of the unit cells (a1). Each of the gate electrode units 29 includes a gate oxide layer 6 which is formed on the epitaxial layer 2 and which extends between the two adjacent ones of the unit cells (a1) to cover a portion of each of the source region 22 of the unit cells (a1), a gate electrode layer 71 which is formed on the gate oxide layer 6, and a first dielectric layer 3 which is formed on the gate electrode layer 71 and which isolates the gate electrode unit 29 and the source electrode unit 27.

Figure 4:
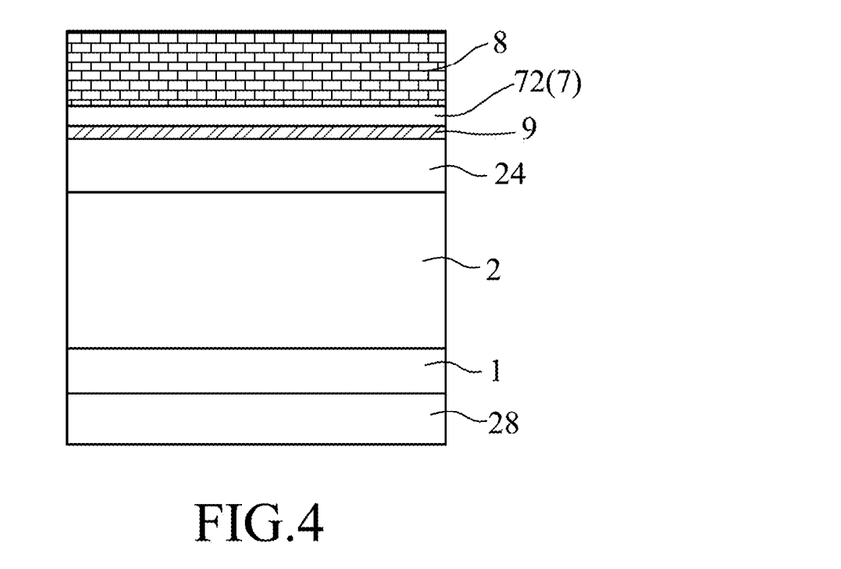
FIG. 4 is a sectional view taken along line IV-IV of FIG. 2, and also illustrates a second dielectric layer, a gate-extending layer and a metal layer formed on the structure shown in FIG. 2.

Referring to FIGS. 2 and 4, the semiconductor device further includes a second dielectric layer 9 which is formed on the doped region 24 of the gate zone (A2), a gate-extending layer 72 which is formed on the second dielectric layer 9 on the gate zone (A2), and a metal layer 8 which is formed on the gate-extending layer 72.

Figure 6:
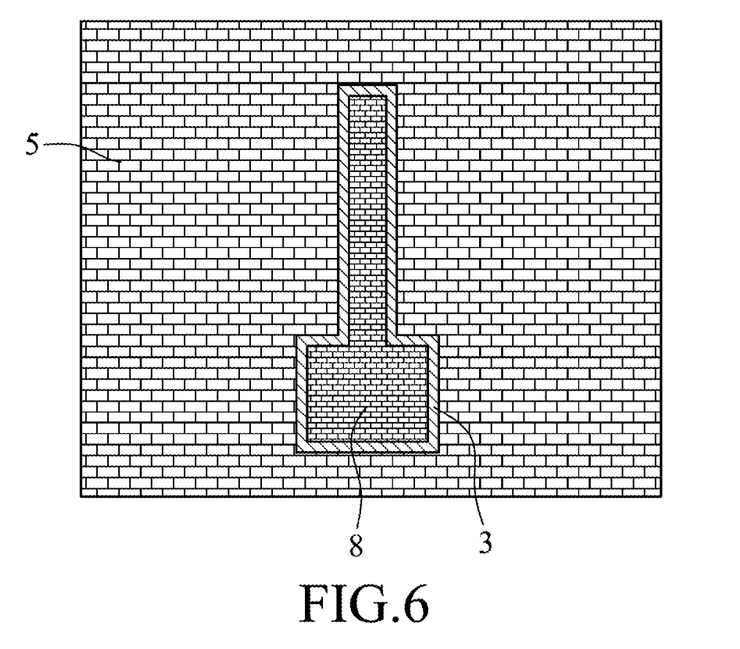
FIG. 6 is a schematic top view illustrating a first dielectric layer, a source electrode layer and the metal layer formed on the structure shown in FIG. 5.

The second dielectric layer 9 on the gate zone (A2) is connected to the gate oxide layer 6 of each of the gate electrode units 29. The gate-extending layer 72 on the gate zone (A2) is connected to the gate electrode layer 71 of each of the gate electrode units 29. The source electrode layer 5 is separated from the metal layer 8 by the first dielectric layer 3, as shown in FIG. 6.

Referring back to FIG. 3, the semiconductor device further includes a drain electrode unit 28 disposed on the semiconductor substrate 1 opposite to the second surface 212 of the epitaxial layer 2.

Referring to FIGS. 7 to 13, an embodiment of a method for manufacturing a semiconductor device is illustrated. First, a semiconductor structure is formed to include a semiconductor substrate 1 and an epitaxial layer 2 formed on the semiconductor substrate 1. In certain embodiments, the semiconductor substrate 1 is an n-type 4H-SiC substrate having a thickness of 350 μm and a doping concentration ranging from $1E19/cm^3$ to $1E20/cm^3$. In some embodiments, the doping concentration of the semiconductor substrate 1 is $2E19/cm^3$. The epitaxial layer 2 is formed on the semiconductor substrate 1 by metal organic chemical vapor deposition (MOCVD), has a doping concentration ranging from $1E14/cm$ to $5E16/cm^3$, and has a thickness ranging from 5 μm to 80 μm. In this embodiment, the epitaxial layer 2 has a thickness of 10 μm and a doping centration of $1E16/cm$.

The epitaxial layer 2 has a central area 2A and a peripheral area 2B surrounding the central area 2A.

Figure 7:
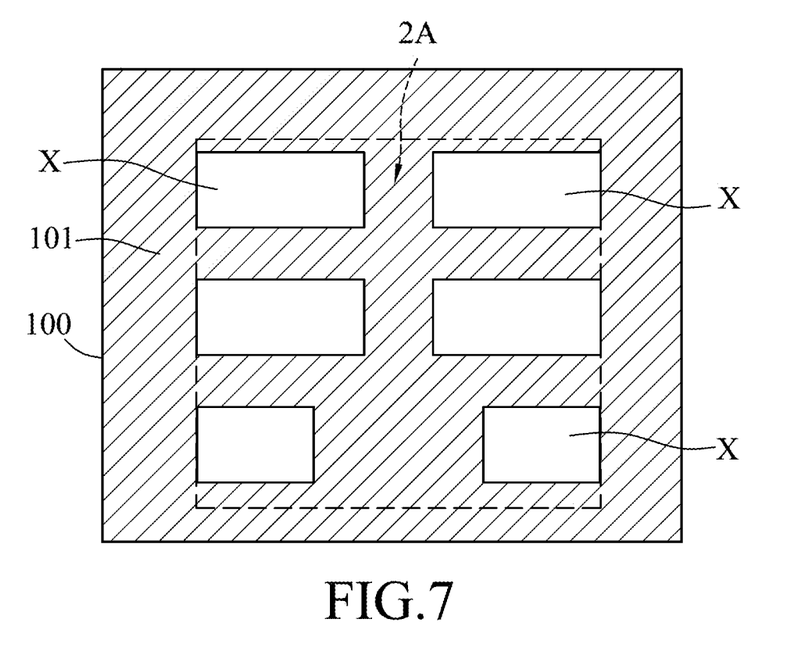
FIGS. 7 to 13 are schematic view illustrating consecutive steps of an embodiment of a method for manufacturing the embodiment of the semiconductor device according to the present disclosure.
Figure 8:
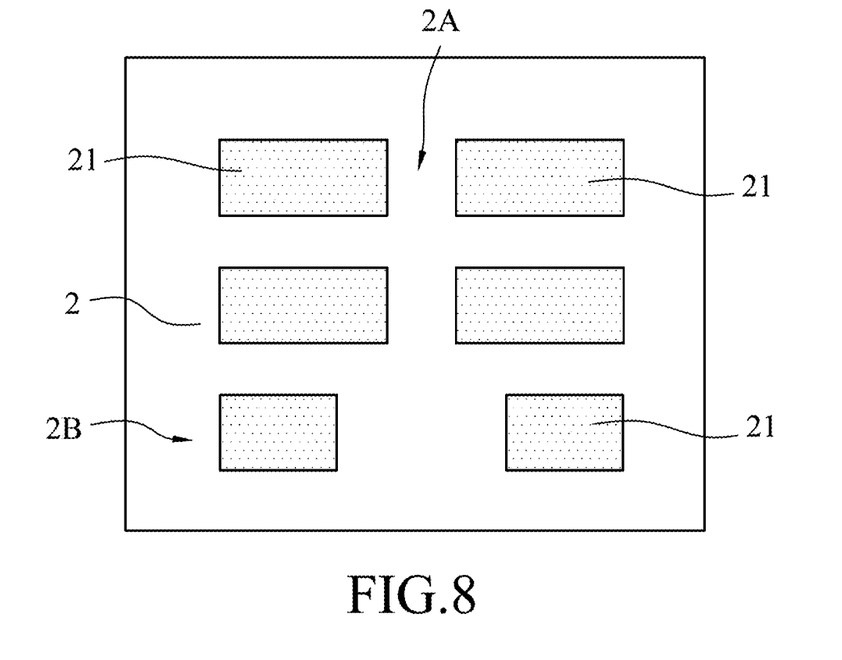

Next, as shown in FIG. 7, a first mask layer 101, which may be made of $SiO_2$, is formed on the epitaxial layer 2 by, e.g., physical vapor deposition (PVD) or CVD. The first mask layer 101 may have a thickness of 2 μm. An etching process is subsequently performed on the first mask layer 101 to form a plurality of first windows (X) which expose a portion of the central area 2A of the epitaxial layer 2. Then, ion implantation is applied to the exposed portion of the central area 2A of the epitaxial layer 2 at a high temperature so as to form a plurality of separated well regions 21 in the central area (2A) of the epitaxial layer (see FIG. 8). The first mask layer 101 is then removed.

Figure 9:
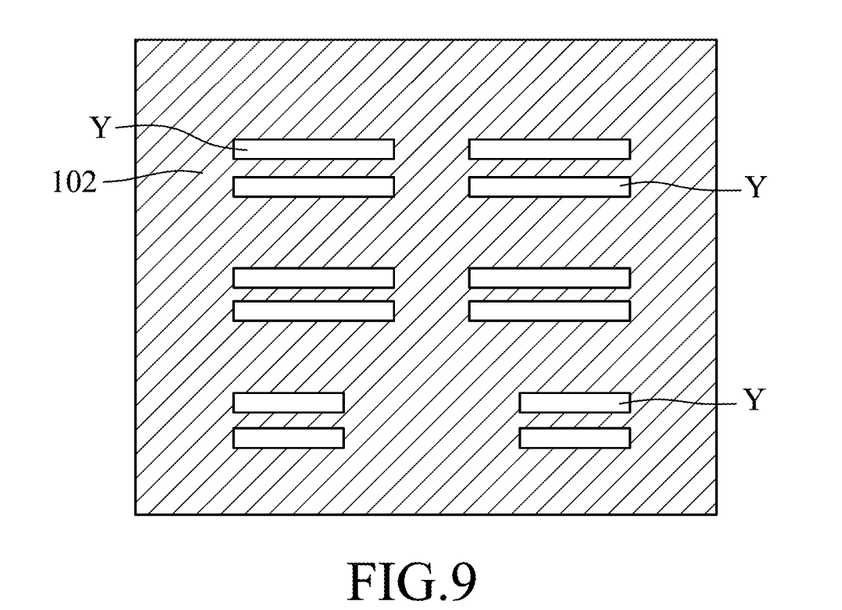
Figure 10:
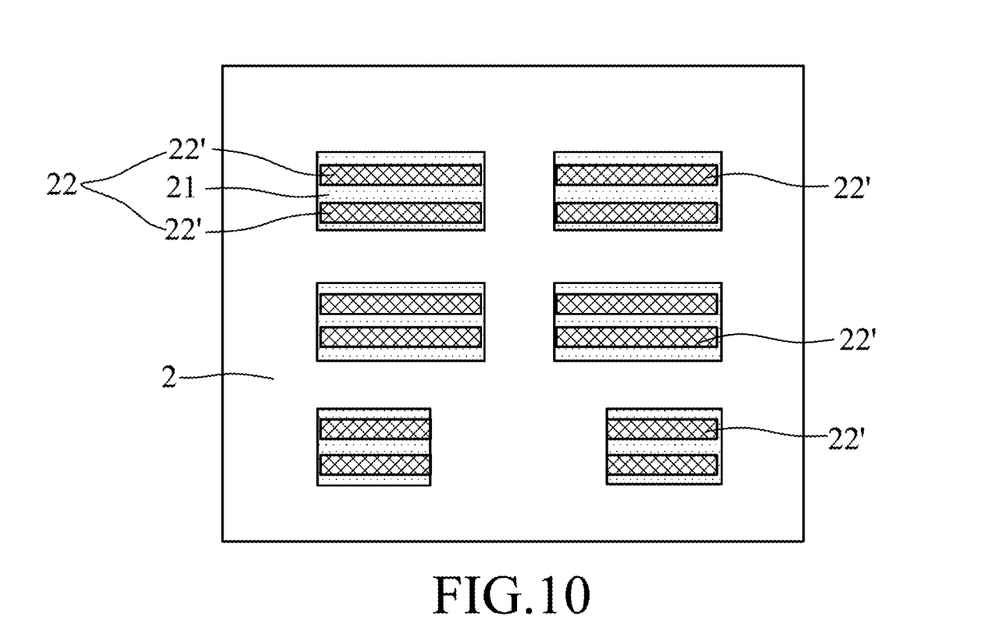

Next, referring to FIG. 9, a second mask layer 102, which may be made of $SiO_2$, is formed on the structure shown in FIG. 8 by, e.g., PVD or CVD. The second mask layer 102 may have a thickness of 1 μm. An etching process is subsequently performed on the second mask layer 102 to form a plurality of second windows (Y). In this embodiment, two of the second windows (Y) are formed on a respective one of the well regions 21 so as to expose a portion of the respective one of the well regions 21. Then, ion implantation is applied to the portions of the well regions 21 exposed from the second windows (Y) at a high temperature so as to form two separated source sub-regions 22' in the respective one of the well regions (21) (see FIG. 10). The second mask layer 102 is then removed. The two separated source sub-regions 22' form the source region 22 of the unit cell (a1).

Figure 11:
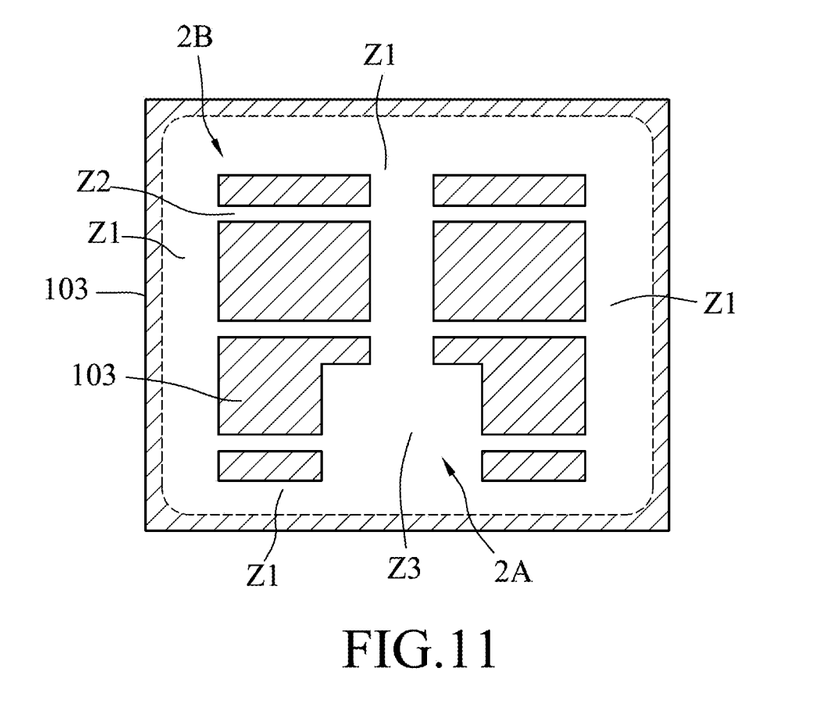

Thereafter, referring to FIG. 11, a third mask layer 103, which may be made of $SiO_2$, is formed on the structure shown in FIG. 10 by, e.g., PVD or CVD. The third mask layer 103 may have a thickness of 1 μm. An etching process is subsequently performed on the third mask layer 103 to form a transition window (Z1), a plurality of cell unit windows (Z2) and a gate window (Z3). The transition window (Z1) and the gate window (Z3) expose the peripheral area 2B of the epitaxial layer 2 and a portion of the central area 2A of the epitaxial layer 2, respectively. Each of the cell unit windows (Z2) exposes a portion of each of the well region 21 which is located between the two source sub-regions 22' in each of the well regions 21. Then, ion implantation is applied to the exposed portion of the well region 21 from each of the unit cell windows (Z2) at a high temperature to form a well contact region 23. The well regions 21, the source regions 22, and the well contact regions 23, of the epitaxial layer 2 together form a plurality of unit cells (a1), thereby forming a cell zone (A1). In the meantime, ion implantation is also applied to the exposed portion of the epitaxial layer 2 in the transition window (Z2) and the gate window (Z3). Thus, a doped region 25 is formed in the peripheral area 2B and a doped region 24 is formed in the central area 2A, so as to form a transition zone (A3) and a gate zone (A2), respectively, as shown in FIG. 1. The doped region 25 of the transition zone (A3) has a ring shape. In some embodiments, the doped region 25 may have a symmetrical shape or an asymmetrical shape. The third mask layer 103 is removed after the well contact regions 23, and the doped regions 24 and 25 are formed.

In this embodiment, each of the well contact regions 23 has a rectangular cross-section as viewed from the first surface 211 of the epitaxial layer 2, and the doped region 25 of the transition zone (A3) and the doped region 24 of the gate zone (A2) are directly connected to each of the well contact regions 23. In some embodiments, the doped region 25 of the transition zone (A3) is separated from each of the well contact regions 23, as shown in FIG. 15, and each of the well contact regions 23 may have a plurality of separated sub-regions. In certain embodiments, as shown in FIG. 15, each of the sub-regions of each of the well contact regions 23 has a hexagonal cross-section as viewed from the first surface 211 of the epitaxial layer 2.

Next, a gate oxide layer 6 is formed on the epitaxial layer 2 by thermal oxidation growth and annealing. The gate oxide layer 6 extends between two adjacent ones of the unit cells (a1) to cover a portion of each of the source region 22 of the unit cells (a1), and may have a thickness ranging from 30 nm to 60 nm. The thermal oxidation growth and the annealing are performed at a temperature ranging from 1200° C. to 1450° C. In some embodiments, the thermal oxidation growth and the annealing are performed at a temperature of 1300° C. The thermal oxidation growth is performed for a time period ranging from 10 min to 30 min. In some embodiments, the thermal oxidation growth is performed for a time period of 20 min. The annealing is performed for a time period ranging from 30 min to 300 min. In some embodiments, the annealing is performed for a time period of 90 min.

Then, a second dielectric layer 9 is formed on the doped region 24 of the gate zone (A2) by thermal oxidation growth or deposition (such as CVD). The second dielectric layer 9 may be made of $SiO_2$, and has a thickness ranging from 30 nm to 60 nm. The second dielectric layer 9 on the gate zone (A2) is connected to the gate oxide layer 6 of each of the gate electrode units 29.

Next, a polycrstalline silicon (poly-Si) layer 7 is deposited on the gate oxide layer 6 and the second dielectric layer 9 to form a gate electrode layer 71 and a gate-extending layer 72, respectively. The poly-Si layer 7 has a thickness ranging from 200 nm to 1000 nm. In some embodiments, the thickness of the poly-Si layer 7 is 800 nm. The poly-Si layer 7 is isolated from the epitaxial layer 2 due to the connection of the second dielectric layer 9 and the gate oxide layer 6.

Figure 12:
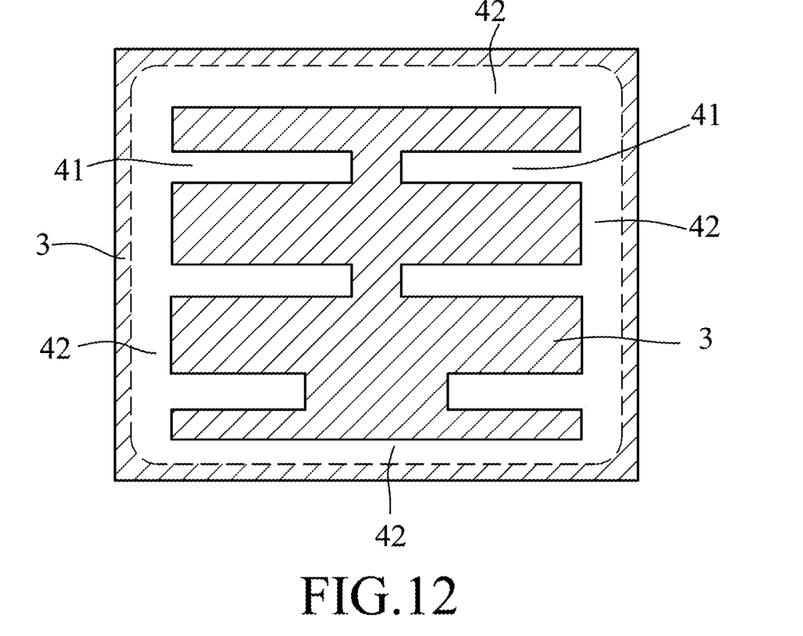

After that, a first dielectric layer 3 is formed on the gate electrode layer 71, the gate-extending layer 72, and the exposed portions of the unit cells (a1) and the transition zone (A3). The first dielectric layer 3 may be made of $SiO_2$, and may have a thickness ranging from 0.4 μm to 1.2 μm. The first dielectric layer 3 may be formed by deposition. As shown in FIG. 12, the first dielectric layer 3 is then etched to form a plurality of ohmic contact openings 41 and a transition opening 42. Each of the ohmic contact openings 41 exposes the well contact region 23 and a portion of the source region 22 of each of the unit cells (a1), and the transition opening 42 exposes the transition area (A3).

Figure 13:
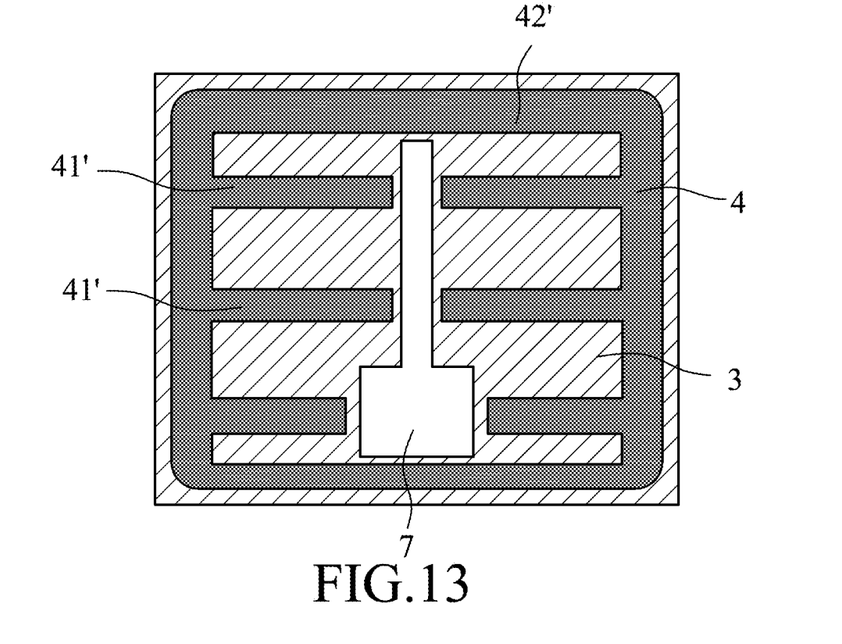

Next, a first ohmic contact layer 41' and a second ohmic contact layer 42' are formed in the ohmic contact opening 41 and the transition opening 42, respectively, by evaporation or sputtering and annealing. The first ohmic contact layer 41' and the second ohmic contact layer 42' together form a source ohmic contact layer 4, as shown in FIG. 13. The first ohmic contact layer 41' is electrically connected to the well contact region 23 and a portion of the source region 22 of each of the unit cells (a1). The second ohmic contact layer 42' is electrically connected to the doped region 25 of the transition zone (A3). The annealing process may be performed at a temperature ranging from 800° C. to 1100° C. for 60 s to 300 s. The source ohmic contact layer 4 may be made of one of titanium (Ti), nickel (Ni), aluminum (Al), gold (Au), tantalum (Ta), tungsten (W), or combinations thereof. In some embodiments, the source ohmic contact layer 4 is made of Ti/Ni by sputtering, and is annealed at 950° C. for 100 s.

Next, referring again to FIG. 13, the first dielectric layer 3 on the gate zone (A2) is etched to form an opening which exposes a portion of the poly-Si layer 7.

Then, a metal film is formed on the resultant structure shown in FIG. 13 by, e.g., evaporation or sputtering. The metal film may have a thickness ranging from 2 µm to 5 µm. In some embodiments, the metal film is made of aluminum having a thickness of 4 µm. Then, referring back to FIG. 6, a trench is formed to expose a portion of the first dielectric layer 3 so that a source electrode layer 5 is formed on the source ohmic contact layer 4, a metal layer 8 is formed on the gate-extending layer 72, and the source electrode layer 5 and the metal layer 8 are separated from each other by the trench. The metal layer 8 is electrically connected to the poly-Si layer 7 exposed from the opening.

Finally, a drain contact layer (not shown) is formed on the semiconductor substrate 1 opposite to the second surface 212 of the epitaxial layer 2, and a drain electrode unit 28 is formed on the drain contact layer. In some embodiments, the drain electrode unit 28 is made of Ni/Ag, and has a thickness of 1.2 µm. In some embodiments, the drain contact layer and the source ohmic contact layer 4 may be simultaneously formed and annealed.

Figure 14:
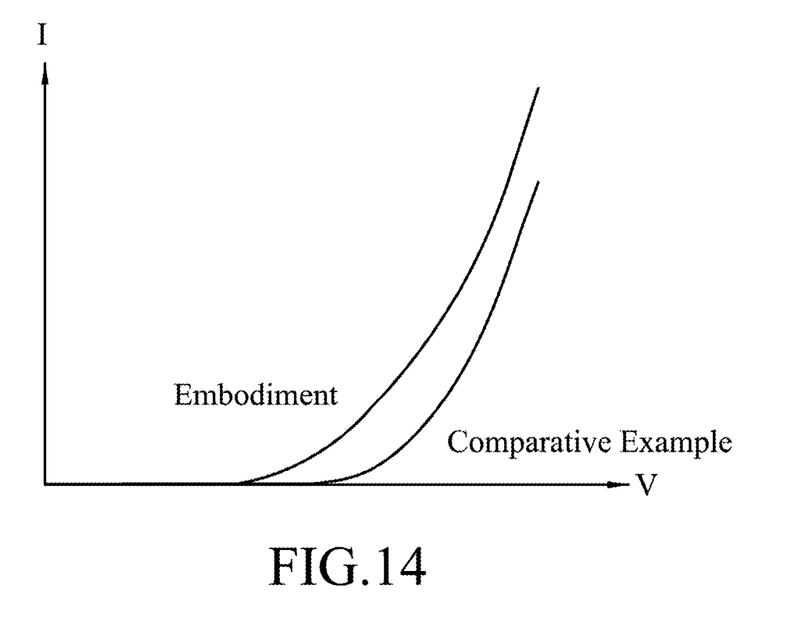
FIG. 14 is a graph showing current-to-voltage (I-V) curves of the embodiment of the semiconductor device and a comparative example.

FIG. 14 is a graph showing current-to-voltage (I-V) curves of the embodiment of the semiconductor device and a comparative example. The difference between the comparative example and the embodiment of the present disclosure lies in that, in the comparative example, doped regions are not formed in the transition zone (A3), and no ohmic contact layer is formed on the peripheral area 2B. In other words, in the comparative example, doped regions as well as the ohmic contact layer disposed thereon are only formed in the cell zone. It should be noted that, from FIG. 14, the capability of current flow of the semiconductor device of the present disclosure is greater than that of the comparative example.

To sum up, formation of the doped region 24 of the gate zone (A2) or the doped region 25 of the transition zone (A3) may increase the area of the doped region (P+ region) in the semiconductor device of this disclosure without increasing the overall area of the semiconductor device, thereby increasing the capability of the current flow of the body diode of the semiconductor device and reducing the power loss during the reverse conduction of the semiconductor device. In addition, since the area of the ohmic contact layer formed on the doped region is increased, the area of the semiconductor device used for dissipating heat may be also increased, thereby enhancing heat dissipation capability, and less heat may be generated due to low resistance of the ohmic contact layer.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A semiconductor device, comprising:
a semiconductor substrate;
an epitaxial layer disposed on said semiconductor substrate;
a cell zone including a plurality of unit cells disposed in said epitaxial layer opposite to said semiconductor substrate, each of said unit cells including a well region having a first conductive type, a source region having a second conductive type and disposed in said well region, and a well contact region having the first conductive type and extending through said source region to contact said well region;
a transition zone surrounding said cell zone and having a doped region which has the first conductive type and which is disposed in said epitaxial layer opposite to said semiconductor substrate and is directly connected to said well contact region of at least one of said unit cells;
a source electrode unit disposed on said epitaxial layer opposite to said semiconductor substrate and including a first portion and a second portion connected to said first portion; and
a plurality of gate electrode units, each of which is disposed on said epitaxial layer opposite to said semiconductor substrate and extends between two adjacent ones of said unit cells to cover a portion of said source region of each of said adjacent ones of said unit cells,
wherein said first portion of said source electrode unit is electrically connected to said well contact region and a portion of said source region of each of said unit cells, and
wherein said second portion of said source electrode unit is electrically connected to said doped region of said transition zone.

2. The semiconductor device of claim 1, wherein
said source electrode unit includes a source ohmic contact layer and a source electrode layer disposed on said source ohmic contact layer,
said source ohmic contact layer of said first portion of said source electrode unit is electrically connected to said well contact region and a portion of said source region of each of said unit cells,
said source ohmic contact layer of said second portion of said source electrode unit is electrically connected to said doped region of said transition zone, and
said first portion is electrically connected to said second portion through said source electrode layer.

3. The semiconductor device of claim 2, wherein said doped region of said transition zone and said well contact region of at least one of said unit cells have the same doping concentration.

4. The semiconductor device of claim 2, wherein said doped region of said transition zone has an implanting depth the same as that of said well contact region of at least one of said unit cells.

5. The semiconductor device of claim 2, further comprising a gate zone surrounded by said transition zone, wherein said second portion of said source electrode unit is of a ring shape and surrounds said gate zone and said cell zone.

6. The semiconductor device of claim 5, wherein said cell zone includes a first zone and a second zone, and said gate zone is disposed between said first zone and said second zone.

7. The semiconductor device of claim 2, wherein said source ohmic contact layer of said first portion of said source electrode unit is electrically connected to said source ohmic contact layer of said second portion of said source electrode unit.

8. The semiconductor device of claim 7, wherein each of said gate electrode units includes:
- a gate oxide layer which is formed on said epitaxial layer and extends between said two adjacent ones of said unit cells to cover a portion of each of said source region of said unit cells;
- a gate electrode layer which is formed on said gate oxide layer; and
- a first dielectric layer which is formed on said gate electrode layer and isolates said gate electrode unit and said source electrode unit;

wherein said gate zone includes a doped region which is disposed in said epitaxial layer and is directly connected to said well contact region of at least one of said unit cells, wherein the semiconductor device further includes:
- a second dielectric layer which is formed on said doped region of said gate zone;
- a gate-extending layer which is formed on said second dielectric layer on said gate zone, and
- a metal layer which is formed on said gate-extending layer, wherein said second dielectric layer on said gate zone is connected to said gate oxide layer of each of said gate electrode units, wherein said gate-extending layer on said gate zone is connected to said gate electrode layer of each of said gate electrode units, and wherein said metal layer is separated from said source electrode layer.

9. The semiconductor device of claim 8, wherein said source electrode layer is separated from said metal layer.

10. The semiconductor device of claim 8, wherein said doped region of said gate zone and said well contact regions of at least one of said unit cells have the same doping concentration.

11. The semiconductor device of claim 8, wherein said doped region of said gate zone is disposed in said epitaxial layer and has the same injecting depth as said well contact regions of at least one of said unit cells.

* * * * *